United States Patent [19]
Ito et al.

[11] Patent Number: 5,833,754
[45] Date of Patent: Nov. 10, 1998

[54] DEPOSITION APPARATUS FOR GROWING A MATERIAL WITH REDUCED HAZARD

[75] Inventors: Hiromi Ito; Kazushige Shiina; Tatsuya Ohori; Hitoshi Tanaka; Nobuaki Tomesakai, all of Kawasaki, Japan

[73] Assignee: Fujitsu Limited, Kawasaki, Japan

[21] Appl. No.: 789,193

[22] Filed: Nov. 8, 1991

[30] Foreign Application Priority Data

Nov. 9, 1990  [JP]  Japan ........................... 2-302631

[51] Int. Cl.⁶ .................................................. C23C 16/00
[52] U.S. Cl. ...................... 118/725; 118/715; 118/724; 118/719
[58] Field of Search .................... 118/715, 724, 118/725, 719

[56]  References Cited

U.S. PATENT DOCUMENTS 4,556,584  12/1985  Sarkozy ............................ 427/54.1

FOREIGN PATENT DOCUMENTS

| 0 090 321 | 10/1983 | European Pat. Off. . |
| 0 147 967 | 7/1985 | European Pat. Off. . |
| 0209150 | 1/1987 | European Pat. Off. . |
| 57-128021 | 8/1982 | Japan . |
| 63-299115 | 5/1987 | Japan . |
| 62-239522 | 10/1987 | Japan . |
| 62-280372 | 12/1987 | Japan . |
| 2-146725 | 6/1990 | Japan . |
| 3-083893 | 4/1991 | Japan . |

OTHER PUBLICATIONS

Fowler IBM Tech. Dis. Bul. vol. 22, No. 11, Apr. 1980.
Patent Abstracts of Japan, vol. 6, No. 226 (E–141)(1104) 11 Nov. 1982 & JP–A–57–128021 (Toshiba Kikai KK) 9 Aug. 1982.
M. Ikeda et al., "Uniform Growth of GaAs by MOCVD on Multi–Wafers," Journal of Crystal Growth, vol. 77, No. 1–3, 1 Sep. 1986, Amsterdam, NL, pp. 157–162.

Primary Examiner—Richard Bueker
Attorney, Agent, or Firm—Staas & Halsey

[57]  ABSTRACT

An apparatus for growing a material at high temperature and employing a reaction gas. A reaction vessel is formed of a metal sidewall having outer and inner surfaces, the inner surface surrounding and defining a reaction chamber within the reaction vessel and which is generally vertically oriented. A cooling system maintains the metal sidewall of the reaction vessel at a temperature at which the metal does not produce contamination within the reaction chamber as a result of the high temperature operation, the reactant gases introduced into the reaction chamber or the product gases resultant from the reaction. A support mechanism includes a generally vertically oriented rod member which supports a susceptor, adapted to hold a wafer on which the material is to be grown, within the bottom part of the reaction chamber and, further, seals the reaction chamber. A sleeve is disposed closely adjacent to but spaced from the inner surface of the generally cylindrical metal sidewall portion and is of a material which remains stable at the high temperature of the reaction required for growing the material.

6 Claims, 3 Drawing Sheets

DEPOSITION APPARATUS FOR GROWING A MATERIAL WITH REDUCED HAZARD

BACKGROUND OF THE INVENTION

The present invention generally relates to deposition apparatuses for growing material layers, and more particularly to an improvement of an MOCVD apparatus for growing a compound semi-conductor material epitaxially on a substrate. Particularly, the present invention relates to an MOCVD apparatus having a barrel-type reaction chamber that uses arsine for the source of the group V elements.

The barrel type MOCVD apparatuses generally use a reaction chamber of a quartz glass. The quartz glass is stable even when heated to a temperature above 1000° C. and produces little contamination. On the other hand, the quartz glass is brittle and tends to cause difficulty in the handling of same particularly when the size of the reaction chamber has increased above 300 mm$\phi$. Because of this problem of mechanical stability, recent MOCVD apparatuses having a reaction chamber of large size tend to use stainless steel for the reaction chamber. As stainless steel produce unwanted contaminating gases at the high temperature that is employed in the CVD processes, such a MOCVD apparatus generally uses a cooling system to maintain the reaction chamber at a temperature at which the release of the contaminating gases does not occur. Such a cooling is necessary also from the view point of minimizing the contaminant gases from being released.

FIG. 1 shows a typical example of the MOCVD apparatus that uses a stainless steel reaction chamber 1.

Referring to FIG. 1, a carbon susceptor 2 is placed in the reaction chamber 1 for supporting semi-conductor wafers 10, and the susceptor 2 is held on a quartz supporting rod 3 that is movable up and down between the position 3 and a position 3' (respectively shown in continuous and phantom lines). Under the reaction chamber 1, there is provided a chamber 11 for accommodating the wafers 10 held on the susceptor 2, and the wafers are lowered to the position 3' as a result of lowering of the support rod 3. It should be noted that the support rod 3 has a flange member 3a that establishes a seal of the reaction chamber when moved to the position 3 (shown by the continuous line 3), by making contact with an upper part of the chamber 11. The mechanism for raising and lowering the rod 3 is not illustrated for the sake of simplicity of the drawing.

The reaction chamber 1 is provided with a source gas inlet 4 for introducing a source gas such as arsine into the chamber 1 and an exhaust gas outlet 5 for exhausting a product gas that is formed in the chamber 1 as a result of the reaction. In order to maintain the temperature of the inner wall of the reaction chamber 1 low, it will be seen that a cooling system 8 is provided on the inner wall for circulating a cooling medium that is introduced at an inlet 6 and exhausted at an outlet 7. Without such cooling, the stainless steel reaction chamber 1 releases impurity elements upon being heated and causes a contamination in the crystal that was grown by the apparatus.

The chamber 11 is used for mounting and dismounting the wafers 10 on and from the susceptor 2.

During this process, a nitrogen gas $N_2$ is introduced into the chamber 11 via an inlet $11_1$ and the chamber 11 is flushed with $N_2$ while evacuating via an outlet $11_3$. For this purpose, a blower 13 is connected to the outlet $11_3$. The gas thus evacuated from the chamber 11 is sent to a processing facility 14 for neutralizing the toxicity. In order to monitor the progress of the flushing in the chamber 11, a sensor 12 is connected at a port $11_2$. The sensor 12 may be the model HD2P of Japan Oxygen Company, Ltd., and is used to detect the concentration of the arsine in the chamber 11. When arsine is no longer detected, the chamber 11 is opened and the wafer 10 is replaced.

In this conventional MOCVD apparatus that has the metal reaction chamber 1, it was found that a considerable time is needed after the experiment, until the replacement of the wafer 10 becomes possible. More particularly, arsine of 20–50 ppb was detected when the support rod 3 lowered to the position 3' and the chamber 11 opened for the apparatus having the chamber diameter of 200 mm $\phi$. A similar detection of arsine was made when an air is introduced into the reaction chamber 1. Such a detection of arsine indicates that the opening of the deposition apparatus for replacing the wafer has to be prohibited for a considerable time, and the operational efficiency of the MOCVD apparatus is inevitably reduced. This problem is particularly serious in the apparatuses that are used in the production line. Although the source of arsine is not completely explored, it is thought that a grayish-white or brownish material deposited on the cooled inner wall of the reaction chamber is responsible for this undesirable phenomenon. It was shown that the material is a compound of gallium and arsenic. However, the exact composition or crystal structure is not identified yet.

SUMMARY OF THE INVENTION

Accordingly, it is a general object of the present invention to provide a novel and useful deposition apparatus, wherein the foregoing problems are eliminated.

Another object of the present invention is to provide a deposition apparatus for growing compound semi-conductor materials, wherein the release of toxic arsine gas at the time of replacement of the wafer is eliminated.

Another object of the present invention is to provide a deposition apparatus for growing compound semi-conductor materials on a wafer held on a susceptor, said susceptor in turn being held on a support rod and accommodated in a reaction chamber formed of a metal, material said metal reaction chamber being provided with a cooling system for cooling the inner wall of the reaction chamber, and there is provided a shield of a refractory material such as quartz glass or pyrolytic boron nitride which surrounds the support rod and the susceptor and is disposed along the inner wall of the reaction chamber. According to the present invention, the deposition of toxic materials that release arsine on the cooled inner wall of the metal reaction chamber is eliminated by the shield. More particularly, the deposition of the material occurs not on the cooled inner wall of the reaction chamber but on the shield, of which the temperature is substantially higher than the temperature of the inner wall of the reaction chamber. Thereby, it is believed that the material takes a stable crystal form of gallium arsenide or a modification thereof and the release of toxic arsine does not occur anymore. It is believed that the materials that are deposited directly on the cooled inner wall of the reaction chamber takes a complex crystal form that is close to the amorphous state and easily releases arsine or other toxic compounds when contacted with the air. In the present invention, the problem of a hazard being created in the operation of the apparatus is substantially reduced by preventing the direct deposition of released gaseous products on the cooled inner wall of the reaction chamber.

Other objects and further features of the present invention will become apparent from the following detailed description when read in conjunction with the attached drawings.

DETAILED DESCRIPTION

Figure 1:
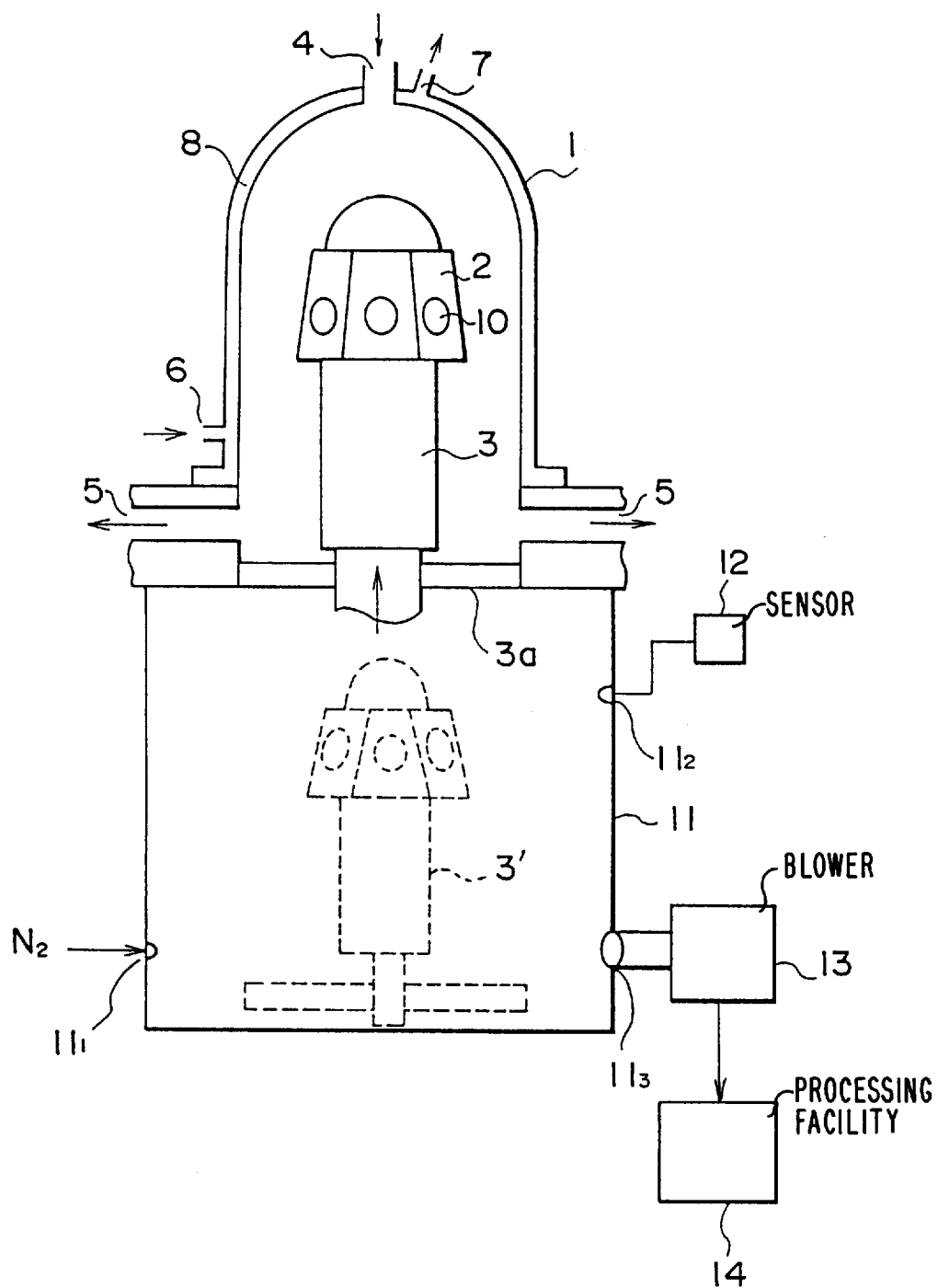
FIG. 1 is a diagram showing a conventional MOCVD apparatus that uses a metal reaction chamber.
Figure 2:
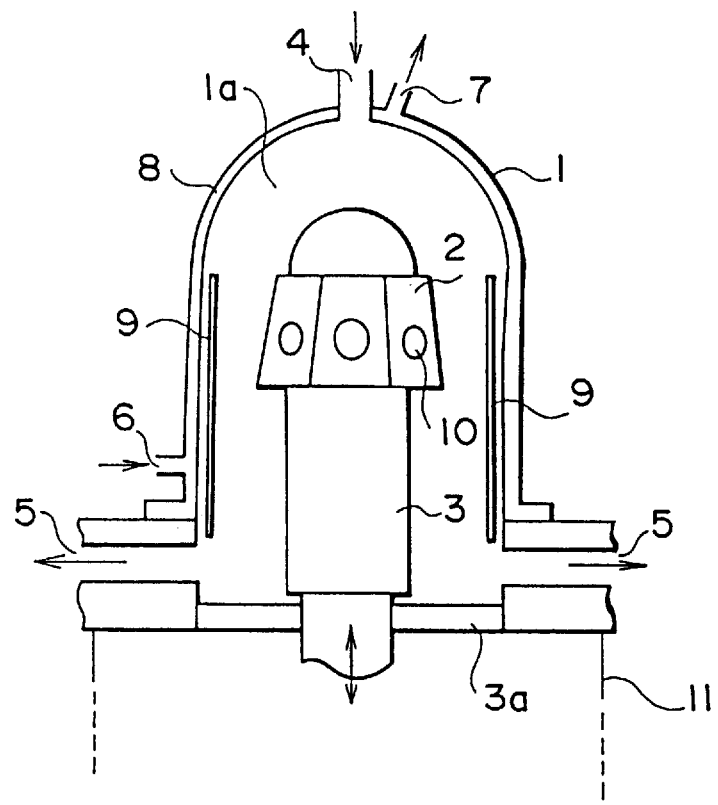
FIG. 2 is a diagram showing a first embodiment of the MOCVD apparatus according to the present invention.

FIG. 2 shows the deposition apparatus according to a first embodiment of the present invention. In FIG. 2, the parts that correspond to those shown in FIG. 1 are designated by the same reference numerals and the description thereof will be omitted.

In FIG. 2, it will be seen that there is provided a sleeve 9 along the inner wall of the metal reaction chamber 1. Typically, a stainless steel is used for the reaction chamber 1, and the chamber 1 has an inner diameter of about 200 mm and a height of about 300 mm. It will be noted that the susceptor 2 is made of carbon while the support rod 3 is made of a quartz glass tube.

In the apparatus of FIG. 2, it will be seen that a sleeve 9 of quartz glass is provided along the inner wall of the chamber 1 with a thickness of about 2 mm to surround the susceptor 2 including the wafer 10 held thereon as well as a major portion of the support rod 3. The sleeve 9 may be provided in contact with the inner wall of the reaction chamber 1, particularly when a heat insulating material is used for the sleeve 9 or when a quartz glass is used for the chamber 1 in combination with the cooling system 8. However, it is more preferable to space the sleeve 9 from the inner wall by a minute distance that is set to prohibit the reactant gases from entering into the space between the sleeve 9 and the inner wall. Typically, the sleeve 9 is separated from the inner wall of the reaction chamber 1 by a distance of 1–2 mm.

In operation, each wafer 10 is set on the susceptor 2 and placed inside the reaction chamber 1 as shown in FIG. 2. After evacuating the reaction chamber 1 to a pressure of about 50 Torr via the exhaust outlet 5, the susceptor 2 is subjected to a heating process by activating an infrared lamp in the reaction chamber (not illustrated) while maintaining the chamber pressure.

In a typical experiment, trimethyl gallium and arsine are introduced at the inlet 4 while maintaining the temperature of the wafer 10 at 650° C. Thereby, a GaAs crystal is grown on the wafer 10. After the growth for one hour, the supply of the source gas is interrupted and replaced with an inert gas such as nitrogen. Further, the susceptor 2 is lowered together with the support rod 3 to the chamber 11 shown in FIG. 1, and the chamber 11 is flushed by nitrogen.

In the experiment conducted on the apparatus having the diameter of 200 mm for the reaction chamber 1, no arsine was detected at the time of replacement of the wafers 10. It should be noted that the model HD2P sensor 12 has a detection limit of about 2 ppb. On the other hand, in the experiment for the apparatus having the diameter of 600 mm for the reaction chamber 1, it took about 5 minutes until the concentration of arsine is reduced below the detection limit. It should be noted that a time of about 30 minutes or more has been needed conventionally by the apparatus that does not use the sleeve 9.

A similar effect was observed when other refractory materials such as pyrolytic boron nitride and carbon are used for the sleeve 9. Generally, any material which is chemically stable at the elevated temperatures here involve such as pyrolytic boron nitride (PBN), carbon or even molybdenum may be used for the sleeve 9.

Figure 3:
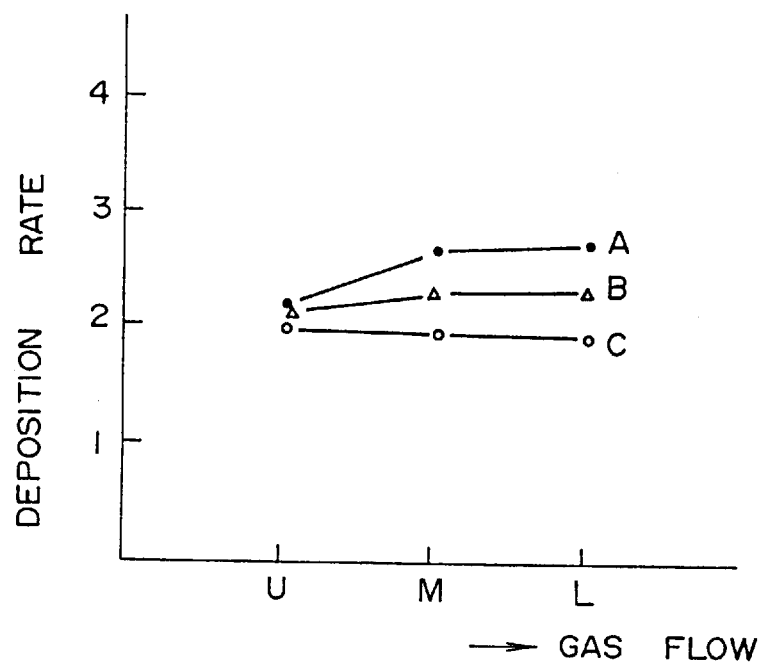
FIG. 3 is a diagram showing the growth of the compound semiconductor layer achieved by the apparatus of FIG. 2.

FIG. 3 shows the result of the experiment undertaken in the apparatus of FIG. 2. In the apparatus of FIG. 2, it was found that the deposition rate changes depending on the axial position of the wafer 10, wherein "U" represents the wafer 10 at the upper part of the reaction chamber 1, "M" represents the wafer at the central part of the reaction chamber 1, and "L" represents the wafer at the bottom or lower part of the reaction chamber 1.

In FIG. 3, the vertical axis represents the deposition rate and the horizontal axis represents the vertical position of the wafer 10 in the reaction chamber 1. The gas flows in the reaction chamber 1 from the top to the bottom in correspondence to the introduction via the inlet 4 at the top of the chamber 1 and the evacuation via the outlet 5 at the bottom of the chamber 1.

It will be noted that the line designated by "C" in FIG. 3 changes little with the vertical position of the wafer in the reaction chamber. This line corresponds to the case where there is no sleeve 9 provided in the apparatus. In this case, therefore, the deposition rate becomes uniform for all the vertical positions of the wafer 10 in the reaction chamber 1. When the sleeve 9 is a quartz glass tube, the deposition rate changes slightly in the top part, in the medium part and in the bottom part of the reaction chamber 1 as shown by the line A. Further, when the sleeve 9 is made of a PBN, the deposition rate changes as shown by a line B in FIG. 3. Summarizing the lines A–C, it seems that there is a tendency that the deposition rate increases in the bottom part of the reaction chamber 1.

Figure 4:
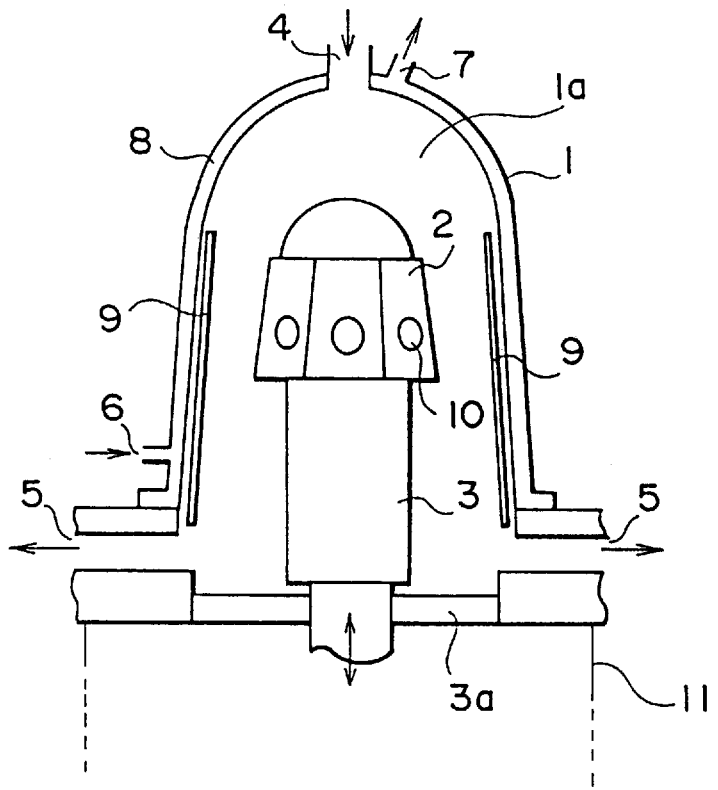
FIG. 4 is a diagram showing a second embodiment of the MOCVD apparatus according to the present invention.

FIG. 4 shows an improvement of the deposition apparatus of FIG. 2. In FIG. 4, the parts that corresponds to those described previously are designated by the same reference numerals and the description will be omitted.

In the present embodiment, the diameter of the reaction chamber 1 is increased a little at the bottom part thereof. For example, the bottom diameter of the chamber 1 may be set to about 230 mm, and thus 30 mm larger than the top diameter. According to the present construction, the flow of the gases in the chamber 1 is changed slightly and the deposition rate becomes uniform throughout the vertical positions when there is a sleeve as shown in FIG. 4.

Figure 5:
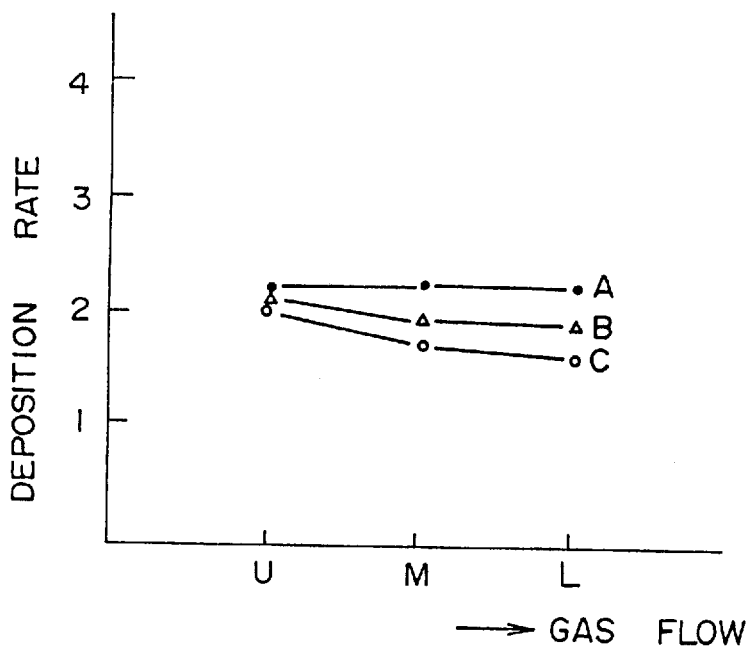
FIG. 5 is a diagram showing the growth of the compound semiconductor layer achieved by the apparatus of FIG. 4.

Referring to FIG. 5, it will be seen that the line A corresponding to the use of the sleeve 9 of quartz glass shows a generally uniform deposition rate as compared the line C where no sleeve is provided. Similar to the diagram of FIG. 3, the line B represents the use of PBN for the sleeve 9. Even in this case, the uniformity in the deposition rate is significantly improved.

Further, the present invention is not limited to the embodiments described heretofore, but various variations and modifications may be made without departing from the scope of the invention.

What is claimed is:

1. An apparatus for growing a material at a high temperature and employing a reactant gas, comprising:

a reaction vessel formed of a metal wall having outer and inner surfaces and shaped to define therewithin a reaction chamber which is generally vertically oriented and comprises a bottom part and a closed, top part;

a cooling system associated the reaction vessel and operable to maintain at least the inner surface of the metal wall at a temperature which is sufficiently low such that the metal material of the metal wall does not produce contamination within the reaction chamber during normal, high temperature operation thereof;

an inlet associated with the reaction vessel for introducing a reactant gas containing arsenic into the reaction chamber;

an outlet associated with the reaction vessel for exhausting gas products that are formed in the reaction chamber during the operation thereof for growing a material;

a susceptor adapted for holding a wafer thereon, and onto which wafer the material is to be grown;

a support mechanism having a rod member which is disposed generally vertically within the reaction vessel and is selectively movable to an upper position within the reaction chamber, through the bottom part of the reaction chamber, the rod member having a top end on which the susceptor is mounted and thereby moved into and out of the reaction chamber, and a sealing element for sealing the reaction chamber in the upper position of the rod member; and a sleeve member disposed within the reaction chamber at a fixed position relatively to the metal wall of the reaction vessel and maintained at the fixed position during movement of the rod member into and out of the reaction chamber, the sleeve member being closely adjacent to but spaced from the inner wall surface of the bottom part of the reaction vessel for shielding the inner wall surface of the bottom part of the reaction vessel from the reactant gas and reactant products and being formed of a solid material which is chemically inert with respect to the reactant gas and with respect to product gases formed as a result of the high temperature gas reaction produced within the reaction chamber for growing the material on the wafer, the solid material of the sleeve member being selected from the group consisting of quartz glass, pyrolitic boron nitride and carbon.

2. The apparatus recited in claim 1, wherein the material of the metal wall comprises stainless steel.

3. The apparatus recited in claim 1, wherein the sleeve member is disposed in surrounding relationship with respect to the rod member.

4. The apparatus recited in claim 1, further comprising:

a base member on which the reaction vessel is supported and having an interior space therein, arranged as a continuation of the bottom part of the reaction chamber;

the support mechanism being movable between a first position in which the rod member with the susceptor mounted thereon is disposed within the reaction chamber and a second position, lowered with respect to the first position, in which the rod member with the susceptor mounted thereon is received within the interior space of the base member; and the base member further having an inlet for introducing an inert gas into the interior space of the base member and thereby into the reaction chamber for flushing same, and an outlet for exhausting the inert gas and other gases and particulate materials, as flushed thereby, from the reaction chamber and the interior space of the base member.

5. The apparatus recited in claim 1, wherein the metal sidewall includes a generally cylindrical portion comprising the bottom part and a generally hemispherical portion comprising the closed, top part of the reaction vessel; and the sleeve member is disposed within the bottom part of the reaction chamber, closely adjacent to but spaced from the inner surface of the generally cylindrical sidewall portion.

6. The apparatus as recited in claim 5, wherein:

the generally cylindrical sidewall portion is of gradually increasing diameter, extending from the upper edge to the lower edge thereof; and the sleeve member is of generally cylindrical configuration but of gradually increasing diameter, extending from the upper edge to the lower edge thereof, in correspondence to the gradually increasing diameter of the generally cylindrical sidewall portion.

* * * * *

UNITED STATES PATENT AND TRADEMARK OFFICE
CERTIFICATE OF CORRECTION

PATENT NO.: 5,833,754
DATED : November 10, 1998
INVENTOR(S): Hiromi ITO et al.

It is certified that error appears in the above-identified patent and that said Letters Patent is hereby corrected as shown below:

Col. 1,     line 8, change "semi-conductor" to --semiconductor--;
           line 16, after "same" insert --,--;
           line 21, change "produce" to --produces--;
           line 32, change "semi-conductor" to --semiconductor--.

Col. 2,     line 11, after "opened" insert --,--;
           line 13, delete "an";
           line 33, change "semi-conductor" to --semiconductor--;
           line 37, change "semi-conductor" to --semiconductor--;
           line 40, change "metal, materia" to --metal material,--.

Col. 4,     line 4, change "involve" to --involved,--;
           line 66, after "associated" insert --with--.

Signed and Sealed this

Eighteenth Day of May, 1999

Attest:

Q. TODD DICKINSON

*Attesting Officer*          *Acting Commissioner of Patents and Trademarks*